United States Patent [19]
Cunningham et al.

[11] Patent Number: 5,518,935
[45] Date of Patent: May 21, 1996

[54] HYDROGENATION OF PHOTORESPONSIVE SEMICONDUCTOR DEVICES

[75] Inventors: John E. Cunningham; Ted K. Woodward, both of Lincroft, N.J.

[73] Assignee: AT&T Corp., Murray Hill, N.J.

[21] Appl. No.: 261,583

[22] Filed: Jun. 17, 1994

[51] Int. Cl.⁶ .......................... H01L 31/18; H01L 21/324
[52] U.S. Cl. .................... 437/5; 437/24; 437/937; 437/247
[58] Field of Search .................. 437/24, 233, 110, 437/133, 937, 941, 247, 176, 22, 2, 3, 5; 118/723 MR

[56] References Cited

U.S. PATENT DOCUMENTS

| | | | |
|---|---|---|---|
| 4,629,514 | 12/1986 | Suda | 437/81 |
| 5,194,398 | 3/1993 | Miyachi et al. | 437/937 |
| 5,248,348 | 9/1993 | Miyachi et al. | 437/4 |
| 5,250,444 | 10/1993 | Khan et al. | 437/937 |
| 5,275,851 | 1/1994 | Fonash et al. | 427/578 |
| 5,282,899 | 2/1994 | Balmashnov et al. | 118/723 R |
| 5,289,015 | 2/1994 | Chirovsky et al. | 257/21 |
| 5,336,533 | 8/1994 | Balmashnov et al. | 427/562 |
| 5,336,623 | 8/1994 | Sichanugrist et al. | 437/4 |
| 5,358,755 | 10/1994 | Li et al. | 427/577 |

OTHER PUBLICATIONS

R. H. Yan et al, IEEE Photonics Tech. Letters, vol. 1, No. 9, Sep. 1989, pp. 273–275.
J. L. Jewell et al, Electronics Letters, vol. 25, No. 17, Aug. 17, 1989, pp. 1123–1124.
S. J. Pearton et al, Hydrogen in Crystalline Semiconductors, book, 1992, pp. 50–62.

Primary Examiner—Olik Chaudhuri
Assistant Examiner—S. Mulpuri

[57] ABSTRACT

Hydrogenation of an optical device that includes an intrinsic region and at least one associated doped region is effective to improve the photoresponsivity of the device. Subsequent annealing of the device substantially restores the conductivity of the doped region(s) while preserving in the intrinsic region a major part of the beneficial effects of hydrogenation.

13 Claims, 3 Drawing Sheets

HYDROGENATION OF PHOTORESPONSIVE SEMICONDUCTOR DEVICES

BACKGROUND OF THE INVENTION

This invention relates to semiconductor devices and, more particularly, to a method for fabricating photoresponsive semiconductor devices.

Photoresponsive semiconductor devices designed for use in a variety of important practical applications are receiving increasing attention. Thus, for example, considerable effort is being directed to the development of photoresponsive semiconductor devices of the so-called surface-normal type. Illustratively, this class of devices includes asymmetric Fabry-Perot modulators and surface-emitting lasers. For a description of a typical such device, see, for example, "Electroabsorptive Fabry-Perot Reflection Modulators with Asymmetric Mirrors", by R. H. Yan et al, *IEEE Photonics Technology Letters,* Vol. 1, No. 9, pages 273–275, September 1989.

In contrast with edge-emitting or waveguide-type optical devices, surface-normal optical devices of the type described in the aforecited article lend themselves relatively easily to the formation of two-dimensional arrays. Such arrays are useful in various applications such as optical interconnects, laser printers and smart-pixel systems.

A typical surface-normal optical semiconductor device includes a multi-layer mirror structure on top of which is formed an intrinsic region comprising a multi-layer electroabsorptive region (for a modulator) or an intrinsic region comprising a multi-layer gain region (for a laser). Another mirror is then formed on top of the electroabsorptive or gain region. An optical cavity, exhibiting resonance at a prescribed wavelength, is thereby formed in the device, as is well known in the art.

Multi-layered photoresponsive semiconductor devices, particularly the intrinsic regions thereof, are relatively precise, complex and sensitive structures. Fabricating such devices in a consistent reproducible manner to exhibit specified characteristics is often extremely difficult. In practice, the manufacturing yield of these devices is thus often relatively low. And this is especially true when large arrays of the devices are made in a batch-fabrication process in which uniformity of large numbers of individual complex devices is sought. As a result, the cost of making certain types of photoresponsive semiconductor devices has heretofore been undesirably high.

Hence, it was recognized that a need existed for an improved method for fabricating photoresponsive semiconductor devices. It was apparent that such a method, if available, would have the potential of increasing the quality and uniformity of manufactured devices while improving the yield of the fabrication process and thereby lowering the cost of the devices.

SUMMARY OF THE INVENTION

In accordance with the principles of the present invention, a semiconductor optical device including an intrinsic region is exposed to hydrogen, whereby the photoresponsivity of the device is improved.

In further accord with the invention, the hydrogen-exposed device is subsequently heat treated, thereby to enhance the conductivity of doped regions associated with the intrinsic region while preserving the beneficial effect of hydrogen on the intrinsic region.

In one aspect, the invention comprises a method for fabricating a semiconductor optical device by exposing the structure to a hydrogen plasma under specified conditions. Hydrogen introduced into the structure passivates defects and impurities in the intrinsic region thereof, thereby improving the photoresponsivity of the device.

In another aspect, the invention comprises a unique semiconductor optical device. In particular, the optical device comprises an intrinsic region characterized by a hydrogen ion concentration of at least about $10^{15}$ ions per cubic centimeter.

BRIEF DESCRIPTION OF THE DRAWING

A complete understanding of the present invention and of the above and other features and advantages thereof will be apparent from the detailed description below taken in conjunction with the accompanying drawing, in which.

DETAILED DESCRIPTION

The principles of the present invention are applicable to a variety of semiconductor optical devices such as, for example, modulators, lasers and detectors. The structure of each such device includes a photoresponsive intrinsic region made of one or more semiconductor materials. Thus, the intrinsic region may, for example, comprise a single layer of silicon (Si), gallium arsenide (GaAs), indium phosphide (InP) or indium gallium arsenide (InGaAs), or alloys of these materials. Advantageously, the intrinsic region of the device comprises a conventional multiple-quantum-well (MQW) region that includes multiple well and barrier layers. (See, for example, U.S. Pat. No. 5,289,015 for a detailed description of optical devices that include MQW intrinsic regions.)

For purposes of a particular example, emphasis herein will be directed to the fabrication of a specific illustrative asymmetric Fabry-Perot electroabsorptive light modulator that includes an MQW intrinsic region. The general structure of such a modulator device is well known. What is unique and what will be described in detail below is an inventive and advantageous method for fabricating such devices in a high-yield manner. Moreover, as will be specified later below, the actual structure of devices made in accordance with the inventive method differs in particular respects from conventionally made such devices.

Figure 1:
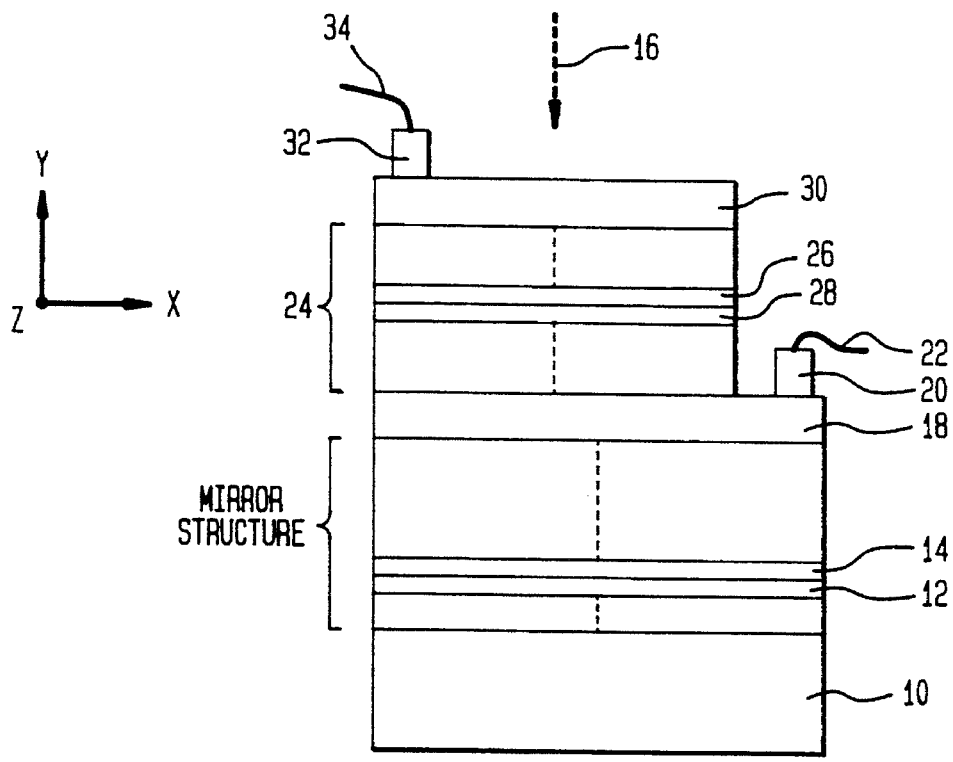
FIG. 1 is a representation in cross-section, not drawn to scale, of a specific illustrative semiconductor optical device made in accordance with the principles of the present invention.

The specific illustrative modulator device shown in FIG. 1 comprises a substrate 10 made, for example, of a III-V semiconductor material. Illustratively, the substrate 10 comprises undoped GaAs. Alternatively, the substrate 10 may comprise n-doped GaAs (doped, for instance, with Si) or p-doped GaAs (doped, for instance with zinc). By way of example, the thickness or Y-direction dimension of the substrate 10 is about 500 micrometers (μm). The index of refraction of the substrate 10 is approximately 3.6.

In practice, it is often advantageous to form on the substrate 10 of FIG. 1 an integrated circuit assembly comprising multiple optical devices. Herein, so as to simplify the drawing and the accompanying description, only one particular device, a modulator, of such an assembly is explicitly shown in FIG. 1.

In the specific illustrative modulator device of FIG. 1, a conventional dielectric mirror comprising multiple layers is formed on the top surface of the substrate 10. (This top surface is parallel to the X-Z plane depicted in FIG. 1.) Illustratively, the mirror structure comprises sixteen identical pairs of layers. Only one such pair, comprising layers 12 and 14, is explicitly depicted in FIG. 1.

By way of a particular example, the mirror layer 12 of FIG. 1 comprises a 599-Angstrom-unit-thick layer of $Al_{0.11}Ga_{0.89}As$ having an index of refraction of about 3.5. Illustratively, the mirror layer 14 comprises a 711-Angstrom-unit-thick layer of AlAs having an index of refraction of approximately 2.9.

For a modulator device designed to operate at a particular center optical wavelength, each layer of the mirror structure shown in FIG. 1 is fabricated to have a thickness equivalent to λ/4n, where λ is the center optical wavelength of the device and n is the index of refraction of the layer. Such a conventional multi-layered mirror structure is typically designed to be highly reflective to optical signals at the center wavelength.

Optical signals to be reflected by the aforedescribed mirror structure are directed at the modulator device of FIG. 1 approximately parallel to the indicated Y axis. Such signals are schematically represented in FIG. 1 by dash-line arrow 16.

Further, the FIG. 1 device includes an optically transparent and electrically conductive layer 18 formed on top of the top-most layer of the multi-layer mirror structure. Illustratively, the layer 18 comprises a layer of $Al_{0.11}Ga_{0.89}As$ about 2500 Angstrom units thick suitably doped to render it conductive. The layer 18 has an index of refraction of about 3.5.

An electrical connection is made to the conductive layer 18 of FIG. 1 by means of a standard ohmic contact 20. For the case in which the layer 18 is doped with an n-type dopant such as Si, the contact 20 comprises, for example, a conventional layered structure that includes, from bottom to top: a layer of a gold/germanium alloy, a layer of nickel and a layer of gold. In turn, an electrical lead 22 connects the contact 20 to a source (not shown) of electrical signals that are to modulate optical signals directed at the depicted device.

Overlying the layer 18 of the modulator device of FIG. 1 is an electroabsorptive intrinsic region 24. Illustratively, as indicated earlier above, and as is well known in the art, the intrinsic region 24 advantageously comprises a conventional MQW region that includes multiple alternating well and barrier layers. By way of example, the region 24 comprises sixty identical pairs of layers. Only one such pair, comprising layers 26 and 28, is explicitly shown in FIG. 1.

Illustratively, the layer 26 of the MQW region 24 of FIG. 1 comprises a 100-Angstrom-unit-thick well layer of undoped GaAs, and the layer 28 of the region 24 comprises a 60-Angstrom-unit-thick barrier layer of undoped $Al_{0.45}Ga_{0.55}As$. The region 24 is characterized by an index of refraction of about 3.5.

As is well known, the resonance wavelength of the modulator device shown in FIG. 1 is determined by the bandgap of the MQW region 24. In one particular example, the design of the region 24 is such that the resonance wavelength of the device is specified to be 840 nanometers (nm). In that case, the optical signals directed at the device would have a center wavelength of 840 nm. And, as mentioned above, the aforedescribed mirror structure would be correspondingly designed to be highly reflective at this center wavelength and to exhibit, for example, an optical bandwidth of approximately 800-to-900 nm.

The top-most layer of the FIG. 1 device comprises another optically transparent and electrically conductive layer. This layer, which is designated in FIG. 1 by reference numeral 30, also comprises, for example, a 2500-Angstrom-unit-thick layer of doped $Al_{0.11}Ga_{0.89}As$ having an index of refraction of about 3.5. For the case in which the lower conductive layer 18 is n-doped, the upper layer 30 would advantageously be p-doped. On the other hand, if the lower layer 18 is p-doped, the upper layer 30 would be n-doped. In either case, an appropriate electrical contact 32 is made to the layer 30. In turn, an electrical lead 34 connects the contact 32 to the aforementioned source of electrical modulation signals.

For the case in which the layer 30 is doped with a p-type dopant such as zinc, the contact 32 of FIG. 1 comprises, for example, a conventional layered structure that includes, from bottom to top: a layer of chromium, a layer of a gold/zinc alloy and a layer of gold.

As described, the particular modulator device specified above and shown in FIG. 1 includes an intrinsic region 24 sandwiched between p-type and n-type layers 18 and 30. Thus, the depicted structure is commonly referred to as a p-i-n device.

The top-most layer 30 in FIG. 1 can in effect serve as the required top mirror of an optical cavity formed in the depicted device. In particular, reflection of a portion of the incident optical signal occurs at the interface between the top surface of the layer 30 and the medium (usually air) that overlies the device. The net resultant amount of light that is reflected back from the layer 30 and the lower mirror comprising the aforedescribed multi-layer mirror structure is a function of the electric field applied to the electroabsorptive region 24 included in the optical cavity. Thus, by applying a modulating electrical signal to the region 24 via the leads 22 and 34 as described above, it is possible to control the amount of light that is reflected back from the device, as is well known in the art.

In practice, the manufacture of a relatively complex device such as the one represented in FIG. 1 often produces in the critically important intrinsic region 24 certain defects and/or irregularities which deleteriously affect the photoresponsive characteristics of the device. Thus, for example, the occurrence of deep traps, recombination centers, crystalline defects such as interstitials and vacancies, chemical impurities, etc. in the region 24 can cause the device to have so poor a photoresponsive property as to be unacceptable for use.

For many practical applications, a modified version of the particular p-i-n device shown in FIG. 1 is advantageous. In the modified version, the layer 30 is replaced with a transparent layer that forms a conventional Schottky-barrier contact with the top of the intrinsic region 24. Thus, for example, a standard layer of indium tin oxide about 3000 Angstrom units thick would form such a transparent Schottky-barrier contact.

It is well known that FIG. 1-type devices with Schottky-barrier contacts possess important advantages. For example, arrays of such devices can be fabricated without requiring mesa isolation of the individual devices of the array. Despite this and other advantages, the use of Schottky-barrier-contact optical devices has not been widespread, apparently because known manufacturing processes for the devices exhibit especially low yields.

In accordance with the principles of the present invention, an optical device that includes an intrinsic region is subjected to a hydrogen treatment. The result of the treatment is that the perturbing influences of defects, impurities and other irregularities on the photoresponsive characteristics of the intrinsic region of the device are thereby reduced. In particular, carrier lifetime in the intrinsic region is significantly increased. Moreover, the photocurrent collection efficiency and the exciton linewidth of the device are thereby improved.

In accordance with the invention, hydrogenation is designed to occur either by treating the intrinsic region(s) of an entire wafer at an intermediate point in the overall fabrication process or by treating the regions after the wafer has been processed to form individual devices or arrays of devices. In either approach, the introduction of hydrogen alleviates deleterious effects that would otherwise exist in the finished devices. In practice, the yield of manufactured devices that meet specified operating characteristics is thereby improved.

Illustratively, hydrogenation is carried out in a conventional electron-cyclotron-resonance (ECR) apparatus of a type well known in the art. Hydrogen treatment occurs after at least some of the layers, including in particular the layers of the intrinsic region, have been formed in a standard growth chamber. So as to minimize contamination and to facilitate the overall process, it is advantageous to transfer the structure to be treated directly from the growth chamber to the ECR apparatus via a conventional load lock.

In the ECR apparatus, the intrinsic region of the structure to be treated is subjected to a hydrogen plasma derived from a microwave source. Under the particular conditions specified below, hydrogen ions from the plasma diffuse into the structure and are effective to passivate defects, impurities and other irregularities that exist in the intrinsic region.

In accordance with the invention, substantially pure molecular hydrogen gas is introduced into the chamber of the ECR apparatus that contains the structure to be treated. Illustratively, the gas is introduced into the apparatus at a flow rate of about two standard cubic centimeters per minute. By way of a specific illustrative example, the structure is exposed to the hydrogen plasma for about 90 minutes, with a microwave source current of approximately 10 milliamperes and with a potential of about 70 volts applied between the sample and the plasma. The microwave power level is set at approximately 180 watts. During treatment, the sample is maintained at a temperature of about 300 degrees Celsius. Under these conditions, it is estimated that about $10^{10}$-to-$10^{11}$ hydrogen ions per square centimeter per second bombard the surface of the structure being treated.

To achieve the beneficial effects of the invention, hydrogen ions need to be introduced only into the critical intrinsic region of the structure being treated. But, in practice, hydrogen ions also diffuse into other regions of the structure. In particular, hydrogen ions also diffuse, for example, into the top conductive layer 30 and into a part or all of the bottom conductive layer 18 shown in FIG. 1. The result of this diffusion into the layers 18 and 30 is that shallow donors and acceptors in these doped regions are compensated. Consequently, the effective concentration of donors and acceptors is reduced and the conductivity of the layers 18 and 30 is lowered, which, of course, is not a desirable result.

In accordance with the invention, the aforedescribed compensation or passivation of shallow donors and acceptors in conductive layers of an intrinsic-region-containing structure being treated in a hydrogen plasma is subsequently reversed at least in part. Importantly, such reversal is accomplished while substantially maintaining in the intrinsic region of the structure the beneficial deep-level passivation effects caused by hydrogenation.

Thus, it is generally advantageous to heat treat the device structure after the hydrogenation step. Illustratively, heating the structure for about five minutes at a temperature in the range of approximately 350-to-550-degrees Celsius in a reducing ambient comprising, for example, 85% by volume nitrogen and 15% by volume hydrogen is effective to restore the conductivity of doped layers while maintaining deep-level passivation in the intrinsic region of the structure. Following such a heat treatment, the concentration of hydrogen ions remaining in the intrinsic region is, for example, at least about $10^{15}$ ions per cubic centimeter. In this structural respect, the physical characteristic of the hydrogen-ion-containing intrinsic region of an optical device made in accordance with the invention is different from that of a conventional untreated intrinsic region in such a device. This structural difference can actually be observed and measured in a completed device.

Figure 2:
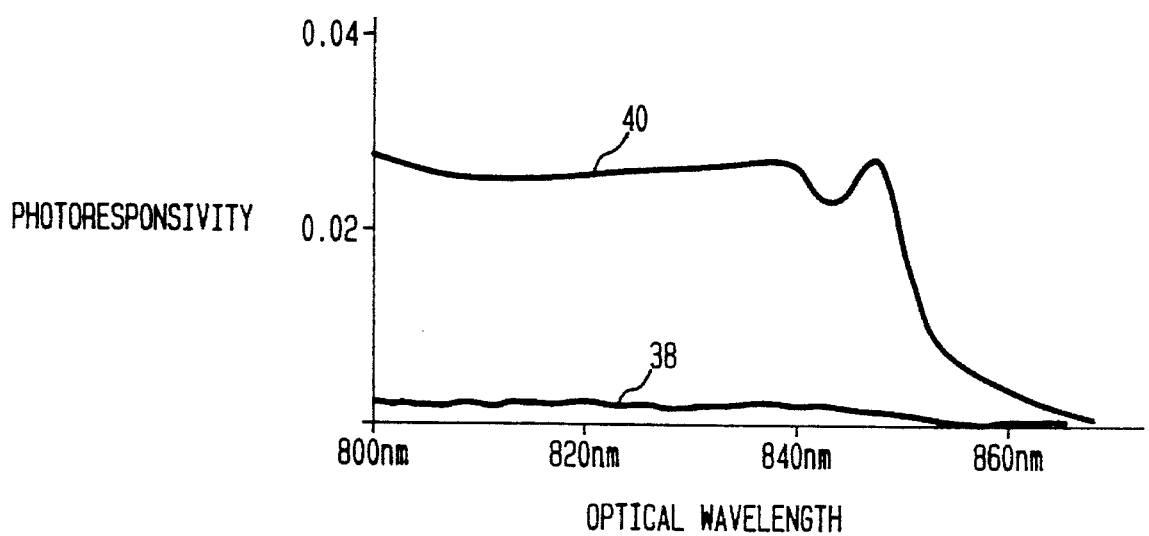
FIG. 2 is a graphical plot of photoresponsivity versus optical wavelength for a FIG. 1-type device that was not subjected to hydrogenation.
Figure 3:
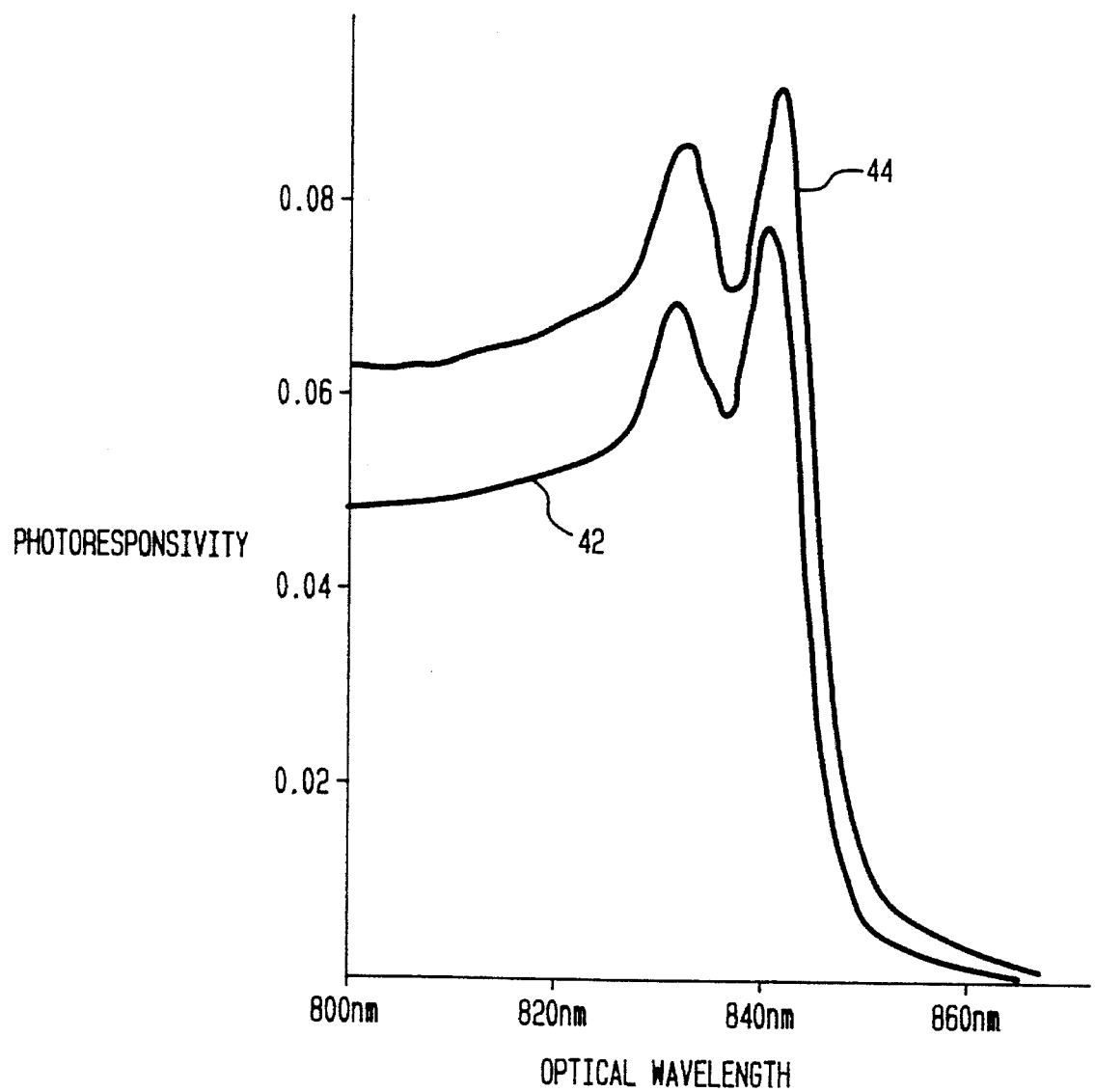
FIG. 3 is a graphical plot of photoresponsivity versus optical wavelength for a FIG. 1-type device that was subjected to hydrogenation in accordance with the principles of the present invention.

The beneficial effects of hydrogen treatment of the intrinsic region of an optical device are evident by comparing FIGS. 2 and 3. For such a region (for example, the region 24 depicted in FIG. 1), FIG. 2 shows the photoresponsivity (output electrical current in response to input optical power) of an untreated intrinsic region at various optical wavelengths. In particular, curve 38 represents the photoresponsivity of the device when 0 volts are applied across the intrinsic region thereof. And curve 40 shows the photoresponsivity of the device when 4 volts are applied across the intrinsic region. Thus, for example, it is apparent that the photoresponsivity of the untreated device at a center optical wavelength of 840 nm is a function of the voltage applied across the electroabsorptive intrinsic region of the device.

The substantial improvement achieved by hydrogenation of the intrinsic region of an optical device is illustrated by FIG. 3. FIG. 3 is a plot for the same basic structure to which FIG. 2 applies. The only difference is that FIG. 3 represents the photoresponsivity of the intrinsic region of the structure after it has been hydrogenated in accordance with the invention, as described in detail above.

Curves 42 and 44 of FIG. 3 represent the photoresponsivity of the hydrogenated device when 0 and 4 volts, respectively, are applied across the intrinsic region thereof. As is evident, the absolute values of the photoresponsivity of the treated intrinsic region (FIG. 3) are significantly greater than the photoresponsivity of the untreated intrinsic region (FIG. 2). Moreover, the pronounced peaks of the curves 42 and 44 of FIG. 3 in the vicinity of 840 nm indicate that the treated intrinsic region exhibits a well-defined exciton characteristic relative to the curves of FIG. 2.

As a practical matter, the improved device characteristic described above and represented in FIG. 3 means that optical devices that otherwise would have been rejected for use can now, after hydrogen treatment, be accepted. Hydrogenation thus improves the manufacturing yield of such devices.

In particular, it has been determined that hydrogenation of the intrinsic region of a p-i-n or Schottky-barrier-contact modulator device of the type represented in FIG. 1 is effective to enhance the photocurrent responsivity and thereby to improve the so-called figure of merit of the device. Figure of merit is, for example, defined as $(R_{HIGH}-R_{LOW}) \times (1-R_{LOW})$, where $R_{HIGH}$ is the net reflectivity of the device to incident light when an electric field is applied to the electroabsorptive intrinsic region thereof, and $R_{LOW}$ is its net reflectivity when no electric field is applied to the region.

The hydrogenation procedure described herein is also applicable to the manufacture of other optical devices that include intrinsic regions. Thus, for example, the specified procedure can be utilized to make a conventional surface-emitting laser of the type described in "Low-Threshold Electrically Pumped Vertical-Cavity Surface-Emitting Microlasers", by J. L. Jewell et al, *Electronics Letters*, Vol. 25, No. 17, pages 1123–1124, Aug. 17, 1989. Such a laser includes an intrinsic region that constitutes a gain medium. Hydrogen treatment of the intrinsic region of the laser is effective to lower its threshold and increase its gain properties. In that way, the manufacturing yield of lasers that must meet specified threshold and gain characteristics is increased.

Figure 4:
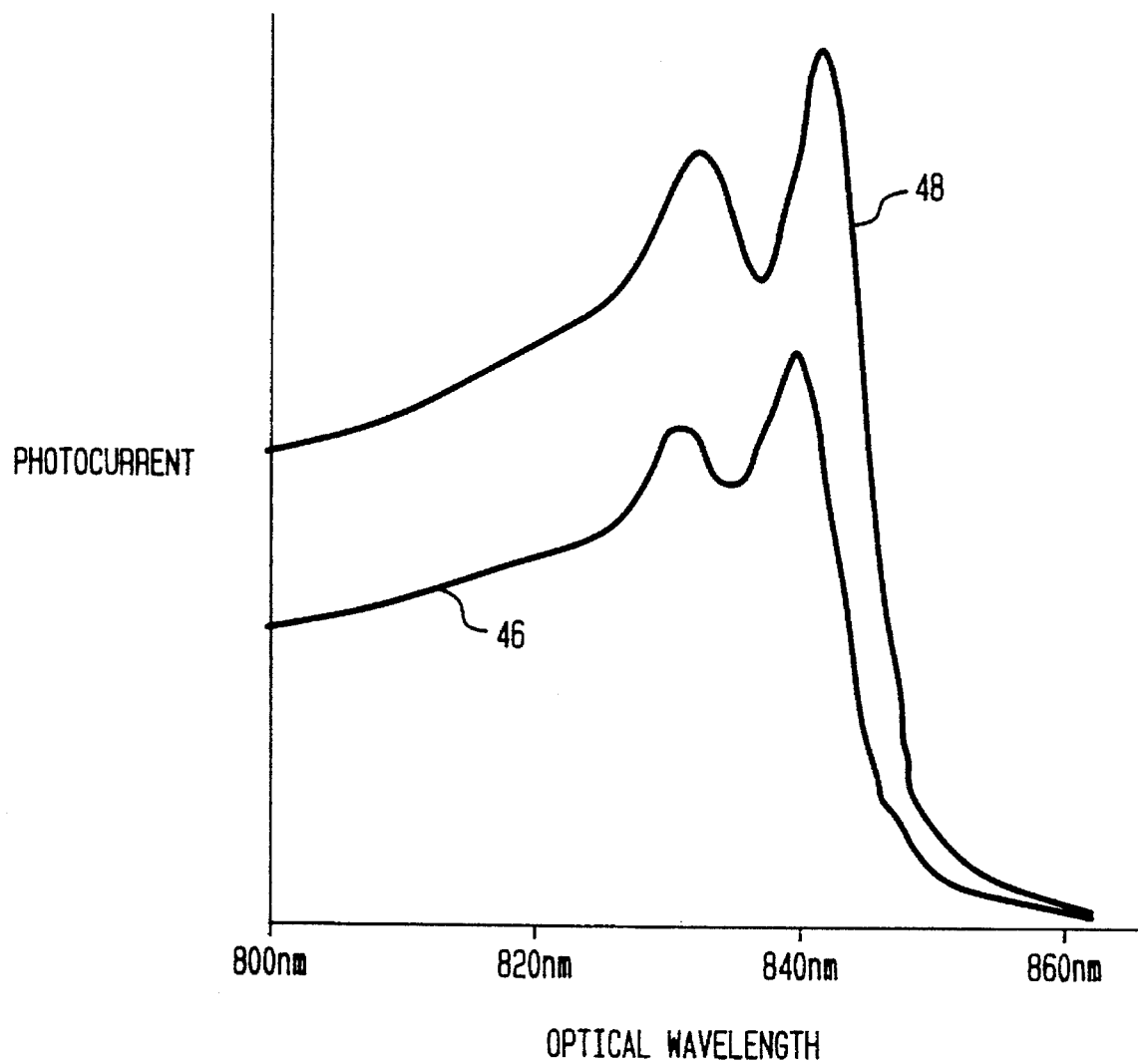
FIG. 4 is a graphical plot of photocurrent versus optical wavelength for a FIG. 1-type device that was hydrogenated and then heat treated in accordance with the invention.

As described earlier above, it is advantageous, in accordance with the invention, to heat treat the device structure after the hydrogenation step. FIG. 4 shows the photocurrent-versus-wavelength characteristic of a specific illustrative such structure after heat treatment at about 550 degrees Celsius for approximately five minutes.

In FIG. 4, curves 46 and 48 represent the photocurrent response of a hydrogenated and annealed optical device for the cases wherein 0 and 4 volts, respectively, are applied across the intrinsic region. The curves 46 and 48 exhibit a clear difference from the corresponding curves 38 and 40 (FIG. 2) of a non-hydrogen-treated structure. And, significantly, the shapes and relative amplitudes of the curves 46 and 48 of FIG. 4 for a heat-treated structure are basically the same as the corresponding curves 42 and 44 (FIG. 3) of a hydrogenated structure before heating.

In accordance with the invention, the beneficial effects of hydrogen passivation of the intrinsic region of an optical device are substantially unaffected by the aforedescribed heat treatment. At the same time, the heat treatment is effective to redistribute and/or remove hydrogen from doped regions of the hydrogen-treated device, thereby to reactivate or reverse a substantial portion of the passivation of shallow donors and acceptors in the doped regions. Advantageously, the electrical conductivity of the doped regions is thereby substantially restored to the prescribed values they had before hydrogenation.

Finally, it is to be understood that the above-described techniques and arrangements are only illustrative of the principles of the present invention. In accordance with these principles, numerous modifications and alternatives may be devised by those skilled in the art without departing from the spirit and scope of the invention.

What is claimed is:

1. A method for fabricating a photoresponsive semiconductor device that includes an intrinsic region, said method comprising the step of hydrogenating the intrinsic region of said device by bombarding said region with hydrogen ions to enhance the photoresponsivity of the device, wherein said hydrogenating step is carried out in a hydrogen plasma, and wherein, subsequent to said hydrogenating step, said device is heat treated in a reducing ambient to establish in said intrinsic region a hydrogen ion concentration of at least $10^{15}$ per cubic centimeter, and to restore the conductivity of said at least one doped region while preserving in said intrinsic region substantially all the photosensitivity enhancement achieved by bombarding said intrinsic region with hydrogen ions.

2. A method as in claim 1 wherein said hydrogen plasma is established in an electron-cyclotron-resonance apparatus.

3. A method as in claim 2 wherein the device is maintained in said apparatus at about 300 degrees Celsius during said hydrogenating step.

4. A method as in claim 3 wherein substantially pure hydrogen gas is introduced into said apparatus during said hydrogenating step.

5. A method as in claim 4 wherein hydrogen gas is introduced into said apparatus during said hydrogenating step at a flow rate of approximately two standard cubic centimeters per minute.

6. A method as in claim 5 wherein a microwave power source in said apparatus is set to provide a current of about 10 milliamperes and a power level of approximately 180 watts during said hydrogenating step.

7. A method as in claim 6 wherein said hydrogenating step is carried out for about 90 minutes.

8. A method as in claim 1 wherein said device includes at least one doped region for establishing electrical contact with said intrinsic region.

9. A method as in claim 1 wherein said heat treatment is carried out at a temperature in the range of about 350-to-550 degrees Celsius for a time of approximately five minutes.

10. A method as in claim 9 wherein said heat treatment is carried out in a reducing ambient comprising about 85% by volume nitrogen gas and about 15% by volume hydrogen gas.

11. A method as in claim 1 wherein said intrinsic region comprises an MQW region.

12. A method as in claim 11 wherein said MQW region comprises the electroabsorptive region of a modulator.

13. A method as in claim 11 wherein said MQW region comprises the gain medium of a laser.

* * * * *